US006642282B2

(12) United States Patent
Shinohara et al.

(10) Patent No.: US 6,642,282 B2
(45) Date of Patent: Nov. 4, 2003

(54) POROUS PARA-ORIENTED AROMATIC POLYAMIDE FILM, PREPREG THEREOF, AND BASE SUBSTRATE FOR PRINTED CIRCUIT BOARD

(75) Inventors: Yasuo Shinohara, Niihari-gun (JP); Tsutomu Takahashi, Tsukuba-gun (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 10/103,886

(22) Filed: Mar. 25, 2002

(65) Prior Publication Data

US 2002/0156140 A1 Oct. 24, 2002

(30) Foreign Application Priority Data

Mar. 30, 2001 (JP) ........................................ 2001-100622

(51) Int. Cl.[7] .................................................. C08J 9/00
(52) U.S. Cl. ............................ 521/53; 521/76; 521/134; 521/138
(58) Field of Search ........................... 521/53, 76, 134, 521/138

(56) References Cited

U.S. PATENT DOCUMENTS

| 5,314,742 A | 5/1994 | Kirayoglu et al. |
| 5,851,646 A | 12/1998 | Takahashi et al. |
| 6,108,903 A | 8/2000 | Nakatani et al. |
| 6,121,171 A | 9/2000 | Takahashi et al. |

FOREIGN PATENT DOCUMENTS

| EP | 0 757 071 A2 | 2/1997 |
| EP | 0 768 334 A2 | 4/1997 |
| EP | 0 870 795 A1 | 10/1998 |
| JP | 5-327148 A | 12/1993 |
| JP | 10-338762 A | 12/1998 |
| WO | WO 93/01333 A1 | 1/1993 |
| WO | WO 93/04300 A1 | 3/1993 |
| WO | WO 96/35742 A1 | 11/1996 |

OTHER PUBLICATIONS

Patent Abstract of Japan, vol. 1999, No. 3, Mar. 31, 1999 (corresponds to JPA 10–338762).

*Primary Examiner*—Morton Foelak
(74) *Attorney, Agent, or Firm*—Sughrue Mion, PLLC

(57) ABSTRACT

Provided is a porous para-oriented aromatic polyamide film which contains fine particles composed of a heat-resistant resin in an amount of 10 to 400 parts by weight based on 100 parts by weight of a pare-oriented aromatic polyamide and has a linear thermal expansion coefficient at 200 to 300° C. of from $-50 \times 10^{-6}$/° C. to $+50 \times 10^{-6}$/° C. The porous para-oriented aromatic polyamide film shows excellent tear propagation resistance and has light weight and low linear thermal expansion coefficient, and is suitable as a prepreg material used for a base substrate for printed circuit board.

9 Claims, No Drawings

POROUS PARA-ORIENTED AROMATIC POLYAMIDE FILM, PREPREG THEREOF, AND BASE SUBSTRATE FOR PRINTED CIRCUIT BOARD

BACKGROUND OF THE INVENTION

1. Field of the Invention

The present invention relates to a porous para-oriented aromatic polyamide film, a prepreg made of this film, and a base substrate for printed circuit board.

2. Description of the Related Art

Recently, in electronic apparatus field, there has been an increasing requirement for high speed signal processing and digitization for high performance. A laminated film using a para-aromatic polyamide (hereinafter, sometimes referred to as para-aramid) film has characteristics of light weight and low linear thermal expansion coefficient, and the use of the laminated film has been developed in this field.

However, this film has low toughness and handling thereof for a circuit board is difficult. There has been known a method of enhancing toughness of para-aramid film by adding a binder composed of a heat-resistant resin. For example, JP-A-10-338762 discloses a porous para-oriented aromatic polyamide film containing short fiber and/or pulp composed of a heat-resistant resin, for example aramid.

However, the tear propagation resistance of the conventional film, which is the index of toughness, is still small, and a film having large tear propagation resistance has been required.

An object of the present invention is to provide a porous para-oriented aromatic polyamide film having a large tear propagation resistance while maintaining the characteristics of para-aramid such as light weight and low linear thermal expansion coefficient. The present invention also provides a method of producing this film, a prepreg obtained by impregnating this film with a thermoplastic resin and/or a thermosetting resin (hereinafter, sometimes simply referred to as resin), and a base substrate for printed circuit board using such a prepreg.

The present inventors have intensively studied to solve the above problems, and resultantly found that a porous para-oriented aromatic polyamide film containing fine particles composed of a heat-resistant resin in a specific amount and having a specific linear thermal expansion coefficient, has a large tear propagation resistance while maintaining the characteristics of a para-aramid such as light weight and low linear thermal expansion coefficient, leading to completion of the present invention.

SUMMARY OF THE INVENTION

Namely, the present invention relates to [1] a porous para-oriented aromatic polyamide film containing fine particles composed of a heat-resistant resin in an amount of 10 to 400 parts by weight based on 100 parts by weight of the para-oriented aromatic polyamide and having a linear thermal expansion coefficient at 200 to 300° C. of from $-50 \times 10^{-6}/°$ C. to $+50 \times 10^{-6}/°$ C.

Also, the present invention relates to [2] a method of producing the porous para-oriented aromatic polyamide film of [1] wherein the method comprises the following steps (a) to (c):

(a) a step of forming a film-like material from a solution containing 0.1 to 10% by weight of a para-oriented aromatic polyamide having an inherent viscosity of 1.0 to 2.8 dl/g, 1 to 10% by weight of a chloride of an alkali metal or alkaline earth metal, and 10 to 400 parts by weight of fine particles composed of a heat-resistant resin based on 100 parts by weight of said polyamide, in a polar amide solvent or a polar urea solvent, (b) a step of depositing a para-oriented aromatic polyamide from the film-like material obtained in step (a), and (c) a step of immersing the film-like material having a deposited para-oriented aromatic polyamide obtained in step (b) in an aqueous solution or an alcoholic solution, eluting the solvent and the chloride of an alkali metal or alkaline earth metal, then, drying to obtain a porous para-oriented aromatic polyamide film.

The present invention also relates to [3] a prepreg obtained by impregnating the porous para-oriented aromatic polyamide film of [1] with a thermoplastic resin and/or a thermosetting resin.

Further, the present invention relates to [4] a base substrate for printed circuit board obtained by using the prepreg of [3].

DETAILED DESCRIPTION OF THE INVENTION

In the present invention, the para-oriented aromatic polyamide is obtained by polycondensation of a para-oriented aromatic diamine with a para-oriented aromatic dicarboxylic dihalide, and substantially composed of repeating units in which amide bonds are connected at the para-position of the aromatic ring or the equivalently oriented position of the aromatic ring (for example, the orientation position extending coaxially or in parallel to the oppsoite direction such as 4,4'-biphenylene, 1,5-naphthalene, and 2,6-naphthalene).

Specifically exemplified are para-aramids of para-oriented or the equivalently oriented structure such as poly(paraphenyleneterephthalamide), poly(parabenzamide), poly(4,4'-benzanilideterephthalamide), poly(paraphenylene-4,4'-biphenylenedicarboxylic amide), poly(paraphenylene-2,6-naphthalenedicarboxylic amide), poly(2-chloro-paraphenyleneterephthalamide) or a coplymer of paraphenylenediamine/2,6-dichloroparaphenylenediamine/terephthalic acid dichloride, and the like. Further, a para-aramid having a phenolic hydroxyl group as a terminal functional group can also be used.

The para-aramid having a phenolic hydroxyl group as an terminal functional group means a terminal hydroxyl group-containing para-oriented aromatic polyamide in which part or all of the terminal functional groups are hydroxyl groups. Such a terminal hydroxyl group-containing para-oriented aromatic polyamide is typically a para-oriented aromatic polyamide having part or all of the molecular chain end bound to an aromatic compound having hydroxyl groups.

The average particle size of fine particles composed of a heat-resistant resin used in the film of the present invention is usually 500 $\mu$m or less, and from the standpoint of uniformity of the film, preferably 200 $\mu$m or less, further preferably 150 $\mu$m or less, particularly preferably 120 $\mu$m or less. Here, the average particle size of the fine particles can be measured by a laser scattering method.

The aspect ratio of fine particles composed of a heat-resistant resin used in the film of the present invention is usually less than 50.

The heat-resistant resin used for the film of the present invention is a resin which is not melted at a temperature of less than 230° C., preferably less than 250° C.

Specific examples of the heat-resistant resin of the present invention include aromatic polyamides such as the above mentioned para-aramid typically represented by poly (paraphenyleneterephthalamide), polyparabenzamide and the like; aromatic polyesters such as polyparabenzoate, polyparaphenylene terephthalate, polyethylene terephthalate and the like; aromatic heterocyclic polymers such as polyparaphenylenebenzobisthiazole, polyparaphenylenebisoxazole; and the like. Of them, aromatic polyamides are preferable, and particularly, poly (paraphenyleneterephthalamide) can be suitably used due to excellent affinity with a porous film.

In the film of the present invention, the amount of the above-mentioned fine particles is from 10 to 400 parts by weight, preferably from 30 to 250 parts by weight, more preferably from 50 to 150 parts by weight based on 100 parts by weight of a para-oriented aromatic polyamide. Out of the above-mentioned range, the tear propagation resistance of the film is insufficient. When over the upper limit, the viscosity of a solution containing the para-oriented aromatic polyamide and fine particles increases too much, causing a difficulty in forming a film-like material from the solution.

The film of the present invention is usually made of fibrils of para-aramid, and has a form of non-woven fabric, microscopically. Namely, the porous para-oriented aromatic film usually has a structure in which fibrils having a diameter of 1 $\mu$m or less composed of a para-aramid are in the form of network or non-woven fabric and laminated in the form of layer.

The film of the present invention usually constituted of fibrils, has a lot of vacant spaces, and the percentage of vacant spaces is usually from 30 to 95%, preferably from 35 to 90%. When the percentage of vacant spaces is less than 30%, the structure may not be substantially porous, and the impregnation amount of varnish prepared by dissolving a thermoplastic resin and/or a thermosetting resin described later in a solvent tends to be insufficient. On the other hand, when over 95%, there is a tendency of low strength of a porous film leading to difficulty in handling. The porous para-oriented aromatic film of the present invention has a linear thermal expansion coefficient (plane direction) at 200 to 300° C. of from $-50\times10^{-6}$/° C. to $+50\times10^{-6}$/° C., preferably from $-25\times10^{6}$/° C. to $+25\times10^{6}$/° C. Low value of this linear thermal expansion coefficient means excellent dimension stability along the plane direction. The linear thermal expansion coefficient of the heat-resistant resin used in the film of the present invention is not particularly restricted, and for controlling linear thermal expansion coefficient at 200 to 300° C. from $-50\times10^{-6}$/° C. to $+50\times10^{-6}$/° C. in the film of the present invention, it is preferable that the heat-resistant resin has a linear thermal expansion coefficient at 200 to 300° C. of from $-50\times10^{-6}$/° C. to $+50\times10^{-6}$/° C.

In the present invention, various additives can be contained according to requirements. For example, a substance having low dielectric constant and high water repellency such as polytetrafluoroethylene and the like may be placed in the form of needle, fine particle, flat plate and the like on the surf ace of or inside the porous film, for the purpose of reducing dielectric constant and water absorption coefficient. Besides, addition of alumina short fiber and the like is also effective in addition to the reinforcement effect.

The thickness of the film of the present invention is not particularly restricted, and preferably from 10 to 150 $\mu$L m, more preferably from 20 to 100 $\mu$m. When less than 10 $\mu$m, there is a tendency of easy crinkling to make the handling difficult. When over 150 $\mu$m, there is a tendency of loss of important characteristics in a laminated film such as light weight and thin thickness.

The porous para-oriented aromatic polyamide film of the present invention can be produced by the following steps (a) to (c):

(a) a step of forming a film-like material from a solution containing 0.1 to 10% by weight of a para-oriented aromatic polyamide having an intrinsic viscosity of 1.0 to 2.8 dl/g, 1 to 10% by weight of a chloride of an alkali metal or alkaline earth metal, and 10 to 400 parts by weight of fine particles composed of a heat-resistant resin based on 100 parts by weight of said polyamide, in a polar amide solvent or a polar urea solvent, (b) a step of depositing a para-oriented aromatic polyamide from the film-like material obtained in step (a), and (c) a step of immersing the film-like material having a deposited para-oriented aromatic polyamide obtained in step (b) in an aqueous solution or an alcoholic solution, eluting the solvent and the chloride of an alkali metal or alkaline earth metal, then, drying to obtain a porous para-oriented aromatic polyamide film.

Further, it is preferable to provide a step (d) of rolling the porous para-oriented aromatic polyamide film obtained in step (c). As the rolling method, for example, rolling can be conducted using a calender roll while controlling the linear pressure (kg/cm) to obtain a film of the intended properties.

Each of the steps is described further in detail below.

The para-aramid solution used in step (a) can be produced suitably, for example, by the operation as described below. Namely, in a polar amide solvent or a polar urea solvent containing a chloride of an alkali metal or alkaline earth metal dissolved in an amount of 1 to 10% by weight, 0.94 to 0.99 mol of a para-oriented aromatic dicarboxylic halide is added based on 1.0 mol of a para-oriented aromatic diamine, and polycondensation is carried out at a temperatures from $-20°$ C. to 50° C. to produce a para-aramid solution having a para-aramid concentration of 0.1 to 10% by weight.

The amount of the chloride of an alkali metal or alkaline earth metal in a para-aramid solution is usually from 1 to 10% by weight, preferably from 2 to 8% by weight. In general, when the amount of the chloride of an alkali metal or alkaline earth metal is less than 1% by weight, the solubility of a para-aramid tends to be insufficient, and when over 10% by weight, there is a tendency that the chloride of an alkali metal or alkaline earth metal is not dissolved in a polar amide solvent or polar urea solvent. The amount of the chloride of an alkali metal or alkaline earth metal in a para-aramid solution is determined based on the amount of a para-aramid (amide group in a para-aramid). Namely, the addition amount into a polymerization system of the above-mentioned chloride is preferably in the range from 0.5 to 6.0 mol, more preferably from 1.0 to 4.0 per 1.0 mol of the amide group produced in polycondensation. When the amount of the chloride is less than 0.5 mol, the solubility of a para-aramid produced tends to be insufficient, and when over 6.0 mol, the solubility thereof tends to exceed the dissolution amount of the chloride in a solvent if the amount of a para-aramid is large.

The para-aramid concentration in a para-aramid solution is usually from 0.1 to 10% by weight, preferably from 1 to 10% by weight, more preferably from 1.3 to 4% by weight. When the para-aramid concentration is less than 0.1% by weight, the productivity may decrease, leading to an industrial disadvantage. When the para-aramid concentration is over 10% by weight, there may be a case in which a para-aramid deposits and a stable para-aramid solution is not obtained. The addition amount of fine particles composed of a heat-resistant resin is usually from 10 to 400 parts by weight, preferably from 30 to 250 parts by weight, more preferably from 50 to 150 parts by weight based on 100 parts by weight of a para-aramid.

The para-aramid in step (a) indicates a para-aramid having an inherent viscosity of usually from 1.0 to 2.8 dl/g, preferably from 1.5 to 2.6 dl/g. When the inherent viscosity is less than 1.0 dl/g, sufficient film strength may not be obtained. When the inherent viscosity is over 2.8 dl/g, a stable para-aramid solution is not obtained easily, and para-aramid may deposit, causing a difficulty in film formation.

Exemplified as the para-oriented aromatic diamine used in polycondensation of a para-aramid in step (a) are paraphenylenediamine, 4,4'-diaminobiphenyl, 2-methyl-paraphenylenediamine, 2-chloro-paraphenylenediamine, 2,6-dichloro-paraphenylenediamine, 2,6-naphthalenediamine, 1,5-naphthalenediamine, 4,4'-diaminobenzanilide, 3,4'-diaminodiphenyl ether and the like. The para-oriented aromatic diamines can be subjected to polycondensation alone or in admixture thereof.

Exemplified as the para-oriented aromatic dicarboxylic dihalide used in polycondensation of a para-aramid in step (a) are terephthalic acid dichloride, biphenyl-4,4'-dicarboxylic chloride, 2-chloroterephthalic acid dichloride, 2,5-dichloroterephthalic acid dichioride, 2-methylterephthalic acid dichioride, 2,6-naphthalenedicarboxylic dichloride, 1,5-naphthalenedicarboxylic dichloride and the like. The para-oriented aromatic dicarboxylic dihalide can be subjected to polycondensation alone or in admixture thereof.

The polycondensation of a para-aramid in step (a) is conducted using a polar amide solvent or a polar urea solvent. As the polar amide solvent, N,N-dimethylformamide, N,N-dimethylacetamide, N-methyl-2-pyrrolidone and the like are listed, and as the polar urea solvent, N,N,N',N'-tetramethylurea and the like are listed. Among these solvents, N-methyl-2-pyrrolidone is particularly preferable.

In step (a), a chloride of an alkali metal or alkaline earth metal is suitably used for the purpose of improving the solubility of a para-aramid in a solvent. Specific examples thereof include, but not limited to, lithium chloride and calcium chloride. Further, hydrochloric acid by-produced in polycondensation can be neutralized by adding a neutralization agent to the above-mentioned para-aramid solution. By neutralization, corrosion of an apparatus caused by hydrochloric acid can be attenuated. Specific examples of the neutralization agent include, but not limited to, calcium oxide, calcium hydroxide, calcium carbonate and the like.

In step (a), when a film-like material is produced, a para-aramid solution can be cast for example on a substrate such as a glass plate, polyester film and the like to maintain the form as a film-like material. As the casting method, various methods can be appropriately adopted such as bar coating, extruding onto a substrate from a T-die, or the like.

In step (b), after formation of a film-like material from a para-aramid solution in step (a), a para-oriented aromatic polyamide is deposited from the film-like material. Here, it is preferable to maintain a temperature of 20° C. or more and a humidity of 0.01 kg water vapor/1 kg dry air, or more. By this deposition method, a uniform structure along the thickness direction can be obtained. At a temperature less than 20° C., deposition tends to take a longer period of time. Also when the humidity is less than 0.01 kg water vapor/1 kg dry air, deposition tends to take a longer period of time.

In step (c), a solvent and a chloride of an alkali metal or alkaline earth metal are removed from the film-like material obtained in step(b). As the removal method, there is for example a method in which a film-like material is immersed in an aqueous solution or an alcoholic solution to elute the solvent and the chloride. When the solvent is removed by evaporation from a film-like material, there can also be adopted a method in which the film-like material is re-immersed in the above-mentioned solution to elute the chloride. As the solution when a solvent or chloride is eluted, an aqueous solution or an alcoholic solution is preferable since it can dissolve the solvent and the chloride together. As the aqueous solution, water may also be used.

The film-like material from which a solvent and a chloride have been removed is then dried to produce the intended porous film. The drying method is not particularly restricted, and various known methods can be used. The film-like material in the present invention means an intermediate form before made into the final product, porous film.

The prepreg of the present invention is obtained by impregnating a porous para-oriented aromatic polyamide film composed of heat-resistant resin fine particles with a thermoplastic resin and/or a thermosetting resin. The thermoplastic resin is not particularly restricted providing it is a resin having thermoplasticity, and the thermoplastic resin has preferably a melting point of 150° C. or more. For a printed circuit laminate which is the main use of the prepreg of the present invention, those manifesting sufficient adhesion with a material forming an electronic circuit are preferable. As the thermoplastic resin, thermoplastic resins at least one selected from a polyether sulfone, polysulfone, polyether imide, polysulfide sulfone, polycarbonate, polyimide, polyamideimide and polyether ketone can be exemplified. These can be used alone or in combination thereof appropriately.

On the other hand, the thermosetting resin is not particularly restricted, and at least one thermosetting resin selected from epoxy resins, bismaleimide-triazine resins, polyimide resins, diallylphthalate resins, unsaturated polyester resins, cyanate resins and aryl-modified polyphenylene ether resins can be exemplified. These can be used alone or in combination thereof appropriately.

As the addition amount of a thermoplastic resin or a thermosetting resin (hereinafter, sometimes simply referred to as resin), the resin/para-aramid ratio (weight ratio) is usually from 1/9 to 7/3, preferably from 3/7 to 7/3. When the weight ratio is less than 1/9, there is a tendency that vacant spaces in a porous film made of a para-aramid cannot be buried sufficiently with a resin. On the other hand, when the weight ratio is over 7/3, there is a tendency that the linear thermal expansion coefficient of a prepreg increases, leading to an unsuitability as a laminate.

In the present invention, a thermoplastic resin and a thermosetting resin can be used each alone as described above, however, it is also possible to use these resins together or separately in the production step of a prepreg. As a simple method, it is also possible to add a thermoplastic resin or a thermosetting resin alone or simultaneously as a composition, to a solution containing a para-aramid in step (a) of producing a porous para-aramid film. Particularly, when a thermoplastic resin is made into a film of a composition with the porous para-aramid of the present invention, the step of impregnating a thermoplastic resin after production of a porous para-aramid film can be omitted.

The form of the prepreg of the present invention is a form in which a porous film composed of heat-resistant resin fine particles and a para-aramid film is impregnated with a thermoplastic resin and/or a thermosetting resin. Usually, it is a form in which vacant spaces are buried, namely impregnated with a resin, in a porous film having a structure in which fibrils having a diameter of 1 μm or less made of a para-aramid are in the form of network or non-woven fabric and laminated in the form of layer. The linear thermal expansion coefficient (plane direction) at 200 to 300° C. of a sheet obtained by hardening the prepreg of the present invention is usually from $-70\times10^{-6}$/° C. to $+70\times10^{-6}$/° C., preferably from $-35\times10^{-6}$/° C. to $+35\times10^{6}$/° C. Thus small linear thermal expansion coefficient shows excellent dimension stability along the plane direction, and it is the most suitable property for a printed circuit laminate.

In the present invention, the method of impregnating a porous film with a thermoplastic resin and/or a thermosetting resin is not particularly restricted, and a conventionally known method of impregnating paper or glass cloth with a thermosetting resin, and other methods, can be applied. For example, the composition containing a thermoplastic resin and a thermosetting resin of the present invention is dissolved in a solvent to prepare a varnish, this varnish is applied on the above-mentioned porous film and the film is impregnated with the varnish, then, a solvent is evaporated to produce a prepreg.

The above-mentioned prepreg can be used suitably as a base substrate for printed circuit board or a laminate since the linear thermal expansion coefficient is low, the mechanical strength is excellent, and adhesion with a metal foil is also excellent. Such a base substrate for printed circuit board and laminate can be produced by usually conducted methods (for example, All of Printed Wiring Board, Denshi Gijutsu, 1986, Jun, Additional volume). Namely, the prepreg of the present invention is used as an insulation layer, and a conductive layer made of a metal foil is laminated to manufacture a printed circuit laminate. As the metal foil, gold, silver, copper, nickel, aluminum and the like can be used.

EXAMPLES

The present invention will be specifically illustrated by the following examples. These are only examples and do not restrict the present invention. Examinations, evaluation methods or judging standards in the examples and comparative examples are as shown below.

(1) Inherent Viscosity

The flow times of a solution prepared by dissolving 0.5 g of a para-aramid polymer in 100 ml of 96 to 98% sulfuric acid, and 96 to 98% sulfuric acid were measured, respectively, by a capillary viscometer at 30° C., and the inherent viscosity was calculated according to the following formula, by the ratio of the flow times measured.

Inherent viscosity=$\ln(T/T_0)/C$[Unit: $dl/g$]

Here, T and $T_0$ represent the flow times of the para-aramid sulfuric acid solution and sulfuric acid, respectively, and C represents the para-aramid concentration (g/dl) in the sulfuric acid solution of para-aramid.

(2) Percentage of Vacant Spaces

A porous film was cut in the form of square (length of one edge: L, cm), and the weight (W: g) and the thickness (D: cm) were measured. The true specific gravity measured by Alchimedes' method was represented by $\rho$ ((g/cm$^3$)), and the percentage of vacant spaces (volume %) was calculated according to the following formula.

Percentage of vacant spaces (volume %)=100−100×$(W/\rho)/(L^2\times D)$ (3) Tensile Test Specimens were punched out by a dumbbell cutter manufactured by Dumbbell Corp. from a porous film, prepreg or sheet obtained by hardening the prepreg, and the tensile strength was measured according to JIS K-7127 using an instron universal tensile tester model 4301 manufactured by Instron Japan.

(4) Peeling Strength with Copper Foil

It was measured according to JIS C-6481.

(5) Linear Thermal Expansion Coefficient

It was measured using a thermal analysis apparatus TMA 120 manufactured by Seiko Denshi K.K. according to ASTM D696, and calculated by the following formula. However, a measuring specimen which had not been annealed before measurement was heated once up to 300° C. in the apparatus, then, measurement was conducted again to give the result, measure value.

$$\alpha 1=\Delta L/L_0\cdot\Delta T$$

wherein,

α1: linear thermal expansion coefficient (/° C.)

ΔL: changed length of specimen $L_0$: specimen length before test

ΔT: temperature difference (° C.)

(6) Tear Propagation Resistance

Specimens were punched out by a dumbbell cutter used for JIS K-7128-1991C method (right angle tear method), manufactured by Dumbbell Corp. from a porous film, and the tensile test was effected according to JIS K-7128-1991C method using an instron universal tensile tester model 4301 manufactured by Instron Japan, and the average stress from the initiation of tearing to breakage was calculated.

(7) Aspect Ratio

Fine particles were photographed by a scanning type electron microscope, the major axes and the minor axes of these fine particles were measured, and the average major axis was divided by the average minor axis to obtain the aspect ratio.

Example 1

1) Synthesis of Terminal Hydroxyl Group-Containing Poly (paraphenyleneterephthalamide)

Synthesis of terminal hydroxyl group-containing poly (paraphenyleneterephthalamide) (hereinafter, abbreviated as terminal hydroxyl group-containing PPTA) was conducted using a 3 liter (1) separable flask equipped with a stirring blade, thermometer, nitrogen flowing tube and powder addition port. The flask was dried sufficiently and charged with 2220 g of N-methyl-2-pyrrolidone (hereinafter, abbreviated as NMP), and 149.2 g of calcium chloride dried at 200° C. for 2 hours was added and the mixture was heated up to 100° C. After complete dissolution of calcium chloride, the temperature was returned to room temperature, and 67.2 g of paraphenylenediamine (hereinafter, abbreviated as PPD) and 6.7 g of 4-aminometacresole (hereinafter, abbreviated as 4-AMC) were added and dissolved completely. 130.7 g of terephthalic acid dichloride (hereinafter, abbreviated as TPC) was divided into ten portions and added every about 5 minutes while maintaining this solution at 20±2° C. Then, the solution was aged for 1 hour while maintaining at 20±2° C., and the solution was stirred for 30 minutes under reduced pressure for extracting bubbles. The resulted polymer solution (polymer dope) showed optical anisotropy. Apart of the solution was sampled and precipitated again in water and removed out as a polymer, and the inherent viscosity of the resulted terminal hydroxyl group-containing PPTA was measured as 1.98 dl/g.

2) Production of Porous Para-Aramid Film, and Linear Thermal Expansion Coefficient A porous film comprising a terminal hydroxyl group-containing PPTA and heat-resistant resin fine particles was produced from the polymer solution in the above 1). Namely, materials were weighed into a 500 ml separable flask equipped with a stirring blade, thermometer, nitrogen injection tuber and liquid addition port, and 100 g of the polymer solution in the above 1) (containing 6 g of terminal hydroxyl group-containing PPTA) was added and the mixture was stirred in a nitrogen flow. 200 g of NMP was added for dilution, then, 1.41 g of calcium oxide was added to neutralize hydrochloric acid by-produced in polycondensation, and filtrated through a wire gauze of 1000 meshes. Then, 6 g of aramid fine particles having an average particle size of 77 $\mu$m and an aspect ratio of 7 (Twaron TW-5011, manufactured by Nippon Aramid K.K.) was weighed and added into the flask and the mixture was stirred for 120 minutes. This dope was passed through a nanomizer three times to disperse the aramid fine particles sufficiently, then, de-foaming was effected under reduced pressure to give a coating dope. A porous film was produced from thus obtained dope according to the following process. On a glass flat plate having a thickness of 10 mm, a PET film having a thickness of 100 $\mu$m was placed, and a stainless coating bar having a diameter of 25 mm was placed on the PET film in parallel so that the clearance from the PET film was 0.7 mm. The PET film was wound and moved in parallel while feeding the coating dope, to coat the dope in the form of PET film. The film was allowed to reside in an atmosphere of 60° C. and a humidity of 40% without movement, to cause deposition of PPTA. The 100 $\mu$m PET film and the deposited aramid-coated film were immersed in ion-exchanged water while keeping integration thereof, and washed for 120 minutes while flowing ion exchanged-water. After washing, the PET film was removed, and only the aramid-coated film was sandwiched by aramid felts, and pushed to a heat drum having a diameter of 1000 mm and dried at 120° C. for a residence time of 5 minutes, to produced a porous film. This film was rolled at a linear pressure of 20 kg/cm using calender rolls having a diameter of 150 mm composed of a metal roll and rubber roll. The resulted porous film had a thickness of 53 $\mu$m and a percentage of vacant spaces of 52%. The linear thermal expansion coefficient at 200 to 300° C. was $-20\times10^{-6}/°$ C. The tear propagation resistance was 85 g/mm and the tensile strength was 2 kgf/mm$^2$.

3) Production of Prepreg, Base Substrate for Printed Circuit Board and Laminate (1) Preparation of Varnish To a mixture of the following composition was added a solvent (methyl ethyl ketone, hereinafter, abbreviated as MEK), and the mixture was heated under reflux for 90 minutes while stirring by a magnetic stirrer in a 300 ml Erlenmeyer flask equipped with a reflux rubber, to obtain a varnish. Varnish compounding composition: (parts by weight)

Main agent: Sumiepoxy LDX-4120 (manufactured by Sumitomo Chemical Co., Ltd.) 100.0

Hardener: Dicyandiamide (DICY, manufactured by Tokyo Kasei K.K.) 2.7

Catalyst: 2-methyl-4-ethylimidazole (manufactured by Shikoku Chemical Corp.) 0.2

(2) Production of Prepreg

The porous film produced in 2) was cut in a width of 60 mm, and subjected to calender rolls at a linear pressure of 30 kg/cm, to give a film thickness of 35 $\mu$m. The varnish prepared in (1) was coated on the both surfaces of this porous film. This porous film was sandwiched between fluorine films (trade name: Toyofron 50F, manufactured by Toray Industries Inc.) so that a solvent did not evaporate during impregnation of the varnish, and further pushed to spread the varnish uniformly. After left for 10 minutes, the porous film was impregnated with the varnish uniformly, then, carried onto glass cloth (product mark: YES-2101, manufactured by Nippon Sheet Glass Fiber K.K.) and heated at 150° C. for 3 minutes to remove a solvent, and the epoxy resin was half-hardened to produce a prepreg.

(3) Hardening of Prepreg Single Body and Hardening of Laminate with Copper Foil, and Measurement of Physical Properties The prepreg in the above 4) was placed in the gap of 45 $\mu$m of a spacer, and sandwiched by Teflon sheets, and press-hardened at 160° C. Further, this prepreg was sandwiched by copper foils having a thickness of 12 $\mu$m and subjected to press-hardening at 160° C. The hardened material of the prepreg single body had a linear thermal expansion coefficient of $19\times10^{-6}/°$ C. The peeling strength from the copper foil was 1.0 kg/cm.

Example 2

A porous para-aramid film was produced in the same manner as in 2) of Example 1 except that 3.0 g of aramid fine particles were used and the clearance between the coating bar and the PET film was 0.8 mm, in 2). The resulted porous film had a thickness of 49 $\mu$m and a percentage of vacant spaces of 61%. The linear thermal expansion coefficient at 200 to 300° C. was $-20\times10^{-6}/°$ C. The tear propagation resistance was 70 g/mm and the tensile strength was 3 kgf/mm$^2$. The resulted porous film was a homogeneous film by visual observation. A prepreg was obtained in the method of 3) in Example 1. The hardened material of the prepreg alone had a linear thermal expansion coefficient of $19\times10^{-6}/°$ C.

Comparative Example 1

0.6 g of aramid pulp (Twaron TW-1097, manufactured by Nippon Aramid K.K.; an aspect ratio of 100) was used in 2) of Example 1, to find increase in the viscosity of the coating dope. Though coating was carried out at a clearance between the bar and the PET film of 1.1 mm, a coated film was not obtained due to lack of flowability.

Comparative Example 2

A porous para-aramid film was produced in the same manner as in 2) of Example 1 except that 0.3 g of aramid pulp (Twaron TW-1097, manufactured by Nippon Aramid K.K.) was used, the clearance between the coating bar and the PET film was 1.2 mm, and rolling was not conducted. However, the coated film was cracked due to constriction by deposition, in the deposition process of PPTA. The porous film sampled from good parts, had a thickness of 51 $\mu$m and a percentage of vacant spaces of 62%. The linear thermal expansion coefficient at 200 to 300° C. was $-20\times10^{-6}/°$ C. The tear propagation resistance was 40 g/mm. The resulted porous film was a homogeneous film by visual observation. A prepreg was obtained by the method of 3) in Example 1. The hardened material of the prepreg alone had a linear thermal expansion coefficient of $19\times10^{-6}/°$ C.

Comparative Example 3

A porous para-aramid film was produced in the same manner as in 2) of Example 1 except that aramid fine particles were not used, the clearance between the coating bar and the PET film was 1.2 mm, and rolling was not conducted. However, the coated film was cracked due to constriction by deposition, in the deposition process of PPTA. The porous film sampled from good parts, had a thickness of 45 μm and a percentage of vacant spaces of 41%. The linear thermal expansion coefficient at 200 to 300° C. was $-20 \times 10^{-6}/°$ C. The tear propagation resistance was 10 g/mm, and the tensile strength was 8 kgf/mm². The resulted porous film was a homogeneous film by visual observation. A prepreg was obtained by the method of 3) in Example 1. The hardened material of the prepreg alone had a linear thermal expansion coefficient of $19 \times 10^{-6}/°$ C.

Comparative Example 4

30 g of aramid fine particles were used in 2) of Example 1, to find increase in the viscosity of the coating dope. Though coating was carried out at a clearance between the coating bar and the PET film of 0.6 mm, a coated film was not obtained due to lack of flowability.

According to the present invention, a porous para-oriented aromatic polyamide film showing excellent tear propagation resistance and having light weight and low linear thermal expansion coefficient is provided. This film is suitable as a prepreg material. Further, a base substrate for printed circuit board is provided by using this prepreg.

What is claimed is:

1. A porous para-oriented aromatic polyamide film which contains fine particles composed of a heat-resistant resin in an amount of 10 to 400 parts by weight based on 100 parts by weight of a pare-oriented aromatic polyamide and has a linear thermal expansion coefficient at 200 to 300° C. of from $-50 \times 10^{6}/°$ C. to $+50 \times 10^{-6}/°$ C.

2. The porous para-oriented aromatic polyamide film according to claim 1 wherein the heat-resistant resin is an aromatic polyamide, an aromatic polyester or an aromatic heterocyclic polymer.

3. The porous para-oriented aromatic polyamide film according to claim 1 or 2 wherein the para-oriented aromatic polyamide is a poly(paraphenyleneterephthalamide), poly (parabenzamide), poly(4,4'-benzanilideterephthalamide), poly(paraphenylene-4,4'-biphenylenedicarboxylic amide), poly(paraphenylene-2,6-naphthalenedicarboxylic amide), poly(2-chloro-paraphenyleneterephthalamide) or a copolymer of paraphenylenediamine/2,6-dichloroparaphenylenediamine/terephthalic acid dichloride.

4. The porous para-oriented aromatic polyamide film according to claim 1 wherein the percentage of vacant spaces is 30 to 95%.

5. A method of producing the porous para-oriented aromatic polyamide film according to claim 1 wherein the method comprises the following steps (a) to (c):

(a) a step of forming a film-like material from a solution containing 0.1 to 10% by weight of a para-oriented aromatic polyamide having an inherent viscosity of 1.0 to 2.8 dl/g, 1 to 10% by weight of a chloride of an alkali metal or alkaline earth metal, and 10 to 400 parts by weight of fine particles composed of a heat-resistant resin based on 100 parts by weight of said polyamide, in a polar amide solvent or polar urea solvent, (b) a step of depositing a para-oriented aromatic polyamide from the film-like material obtained in step (a), and (c) a step of immersing the film-like material deposited with a para-oriented aromatic polyamide obtained in step (b) in an aqueous solution or alcoholic solution, eluting a solvent and a chloride of an alkali metal or alkaline earth metal, then, drying to obtain a porous para-oriented aromatic polyamide film.

6. A prepreg obtained by impregnating the porous para-oriented aromatic polyamide film of claim 1 with a thermoplastic resin and/or a thermosetting resin.

7. The prepreg according to claim 6 wherein the thermoplastic resin is a polyether sulfone, polysulfone, polyetherimide, polysulfide sulfone, polycarbonate, polyimide, polyamideimide or polyether ketone.

8. The prepreg according to claim 6 wherein the thermosetting resin is an epoxy resin, bismaleimide-triazine resin, polyimide resin, diallyl phthalate resin, unsaturated polyester resin, cyanate resin or aryl-modified polyphenylene ether resin.

9. A base substrate for printed circuit board obtained by using the prepreg of claims 6, 7 or 8.

* * * * *